US010653010B1

(12) United States Patent
Liu et al.

(10) Patent No.: US 10,653,010 B1
(45) Date of Patent: May 12, 2020

(54) CONNECTION OF MULTILAYER PRINTED CONDUCTIVE INK THROUGH FILLED MICROVIAS

(71) Applicant: Flex Ltd., Singapore (SG)

(72) Inventors: Weifeng Liu, Dublin, CA (US);
William L. Uy, San Jose, CA (US);
Alex Chan, San Jose, CA (US);
Dongkai Shangguan, San Jose, CA (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 16/564,907

(22) Filed: Sep. 9, 2019

(51) Int. Cl.
*H05K 1/09* (2006.01)
*H05K 1/18* (2006.01)
*C09D 11/52* (2014.01)
*H05K 1/11* (2006.01)
*H05K 1/16* (2006.01)

(52) U.S. Cl.
CPC ............ *H05K 1/092* (2013.01); *C09D 11/52* (2013.01); *H05K 1/113* (2013.01); *H05K 1/181* (2013.01); *H05K 1/16* (2013.01); *H05K 2201/0305* (2013.01)

(58) Field of Classification Search
CPC ......... H05K 1/092; H05K 1/113; C09D 11/52
USPC ................................................ 174/257, 262
See application file for complete search history.

(56) References Cited

U.S. PATENT DOCUMENTS

| | | | | |
|---|---|---|---|---|
| 5,216,207 A | * | 6/1993 | Prabhu | C03C 14/004 106/1.13 |
| 6,972,152 B2 | * | 12/2005 | Taggert | C23C 30/00 174/257 |
| 2006/0289203 A1 | * | 12/2006 | Oda | H01L 21/486 174/264 |
| 2009/0114431 A1 | * | 5/2009 | Kuroda | H05K 3/244 174/257 |
| 2012/0118618 A1 | * | 5/2012 | Min | H01L 21/486 174/257 |

OTHER PUBLICATIONS

U.S. Appl. No. 16/564,868, filed Sep. 9, 2019, Liu et al.

* cited by examiner

*Primary Examiner* — Sherman Ng
(74) *Attorney, Agent, or Firm* — Sheridan Ross P.C.

(57) ABSTRACT

Attaching electronic components to a substrate can be challenging in certain applications. By utilizing printed conductive ink to fill vias, one or more conductive layers may be provided, which allow for fine pin pitches or other crowded substrates to utilize multiple layers for traces connecting the contact pad to the pins of an electronic component. By applying a substrate with conductive ink and then selectively applying a solderable ink on the conductive ink, and with conductive ink filling the vias, electronic components may be attached to a substrate that provides mechanical attachment and electrical connectivity which may also be formable or flexible.

15 Claims, 7 Drawing Sheets

CONNECTION OF MULTILAYER PRINTED CONDUCTIVE INK THROUGH FILLED MICROVIAS

CROSS REFERENCE TO RELATED APPLICATIONS

The present application incorporates by reference U.S. patent application Ser. No. 16/564,868 filed Sep. 9, 2019, entitled, "SOLDER ELECTRONIC COMPONENTS TO PRINTED CONDUCTIVE INK", the entire disclosure of which is hereby incorporated by reference.

FIELD OF THE DISCLOSURE

The present disclosure is generally directed to electronics and more specifically to the attachment of electronic components to a substrate utilizing printed conductive ink.

BACKGROUND

Electronic components (e.g., resistors, capacitors, microprocessors; fans, etc.) are commonly mounted to a printed circuit board (PCB) by solder to both electrically and mechanically attached the components to the PCB. Typical; PCB and flexible printed circuits (FPC) use copper traces that are not as flexible as compared to conductive ink. Conductive ink can be used to make circuitry more flexible than traditional FPC, even stretchable. Typically; anisotropic conductive film (ACF), anisotropic conductive paste (ACP), or electrically conductive adhesive (ECA) is applied to bond an electronic component to printed conductive ink. These bonding processes are not compatible with soldered interconnects that are more robust and reliable, particularly the traditional soldering reflow process. Also, conductive ink is not typically solderable, and solderable conductive ink is less flexible than non-solderable conductive ink. Soldered interconnects may also have higher bonding strength, higher throughput, lower cost, and scalable for high volume production.

DETAILED DESCRIPTION

Embodiments of the present disclosure will be described in connection to electronics. While embodiments are generally directed to electronics and more specifically the attachment of electronic components to a substrate utilizing printed conductive ink utilizing a soldering process, it should be appreciated that other embodiments may be utilized without departing from the scope of the disclosure. In addition to attaching electronic components to PCB and creating an FPC, electronic components may be attached to or formed on wearable fabrics to create wearable electronics. Embodiments may also include mounting components utilizing a through-hole mounting process rather than a soldering process as described herein.

While conductive ink is not typically solderable, and solderable conductive ink is less flexible than non-solderable conductive ink, combining solderable and non-solderable conductive inks allow soldered interconnects to be formed. In one embodiment, the method includes conductive ink printing process to apply a conductive ink layer to a non-conductive substrate, a dielectric ink printing, solderable pads fabrication, stencil printing solder paste, attaching one or more components, and a reflow process to create soldered interconnects between the solderable pads, also called contact pads, and electrical connection points of one or more electronic components.

As used herein, solderability is a measure of the ease with which a soldered joint can be made using the solder material. Solderability requires wetting (low contact angle) of the substrate by the solder, as is known in the art. (See, for example, https://en.wikipedia.org/wiki/Wetting, which is herein incorporated by reference).

For solderable ink, as used herein, a solder paste (e.g., SnBiAg, SAC105, SAC305), when melted at sufficiently high temperature, will spread and wet the pads, such as those made through screen printing the solderable ink, such as when applied in paste form at a lower, below melting point temperature, and after melting forms a permanent interconnect through alloying (intermetallic) with metals (such as copper, silver plated copper) in the solderable ink. Non-solderable ink is on the contrary and has one or more properties of, cannot wet, cannot alloy, incorporates a metal (like silver) in the ink which will dissolve in the molten solder, and/or the polymer matrix in the ink cannot sustain the sufficiently high temperature for reflow. Accordingly, non-solderable ink cannot form a permanent conductive bond or interconnect.

Conductive inks are non-solderable (commonly using silver or carbon particles), most are proprietary formulas and the details of the formulas are unknown. In one example, silver coated copper particles are used in the ink. If only silver particles are used, silver will be dissolved in the solder quickly and cannot form a good bonding. When silver coated copper is used, solder will form a bonding with copper particles at the same time copper particles remain embedded in the ink polymer matrix.

In summary, this invention is to use conductive ink to make flexible and stretchable traces and/or pads and use selective plating to make the pads (or non-solderable ink) solderable. Accordingly, general embodiments described herein are directed to making: 1) flexible circuit using conductive ink to make it (flexible, stretchable, and conformable), 2) flexible circuit with solderable pads through selective plating, 3) flexible circuit using reflow process to solder components to substrate, or 4) combinations of the foregoing. As will be described herein, embodiments directed towards a trace (a conductive pathway between pads) and a pad (a geometry to receive a conductive portion of a component for attachment during reflow or other soldering operation, can be used interchangeably depending on the application. In other words, while not common, certain embodiments disclosed herein would allow for certain embodiments describing the use and application of conductive and non-conductive ink for a trace or pad to be used in the other.

The nonconductive substrate is an ink printing carrier having a surface for receiving conductive ink, non-conductive ink, or other types of ink. The nonconductive substrate includes thermoplastic polyurethane (TPU), polydimethylsiloxane (PDMS), polyethylene terephthalate (PET), polyvinylchloride (PVC), polycarbonate (PC), polyethylene (PE), polypropylene (PP), polyimide (PI), polyethylene naphthalate (PEN), polyetherimide (PEI), along with various fluoropolymers (FEP), olefin and/or other polymer. In some embodiments, the substrate is paper or fabric.

Materials in the conductive ink includes silver (Ag), gold (Au), copper (Cu), nickel (Ni), palladium (Pd), platinum (Pt), alloys, composites, and mixtures thereof. Applying the conductive ink includes one or more of dispensing, flat bed screen printing, roll to roll screen printing, gravure printing, inkjet printing, aerosol jet printing, or flexography printing. Forming the opening in the conductive layer includes one or more of mechanical drilling, laser drilling, etching, or selectively applying conductive ink.

Applying the non-conductive dielectric layer includes one or more of spin coating, laminating, dispensing, depositing, flat bed screen printing, roll to roll screen printing, gravure printing, inkjet printing, aerosol jet printing, or flexography printing. Forming the opening in the non-conductive dielectric layer includes one or more of selective applying a dielectric ink, mechanical drilling, laser drilling, or etching.

Solderable pads may be fabricated through selective plating process, e.g., electrolytic or electroless process, or by printing solderable conductive ink. Electroless plating may require the use of a precursor, where the use of a precursor and the materials in the precursor depend on the conductive ink used. Typically, the precursor is a palladium-based material, such as palladium chloride, that may be printed onto the contact pads to activate the contact pad surface. Electroless plating using electroless plating solutions to plate different metals (e.g., a single layer or multilayer, electroless copper, electroless nickel immersion gold, electroless silver, immersion tin). By making the pads solderable, the electronic components can be soldered to the ink printed substrates using a reflow process, where the reflow profile will depend on the solder paste material used. Typical solder paste includes SAC 305, SAC105, other SAC solder alloys, SnBi, and SnBiAg.

In some embodiments, one or more conductive ink layers and one or more contact pads are formed on each of the conductive ink layers. One or more nonconductive dielectric layers may also separate the conductive ink layers. The contact pads may be separated by the non-conductive dielectric layer. Earth-based directional references (e.g., top, bottom, top surface, bottom surface, etc.) are provided with respect to certain illustrations of the figures herein as an aid to clarity and understanding the embodiments, but not in a limiting sense. It should be appreciated that, unless explicitly stated to the contrary, the Earth-based directional references are solely relative to the figure being described (e.g., top is towards the top of the page, top surface of a layer is a surface layer closest to the top of the page, etc.) and may be varied in practice without departing from the scope of the embodiments provided herein. For example, while certain manufacturing techniques may require or benefit from gravity to apply a layer to a surface to a substrate, or other layer, on the side opposite the direction of the Earth. However, other manufacturing techniques (e.g., screen printing solder paste) may have adhesive or other forces sufficient to overcome gravity so as to be indifferent to the orientation of the target surface relative to the Earth. Accordingly, the embodiments described may be modified to alter the orientation described without departing from the scope of the embodiments.

Figure 1:
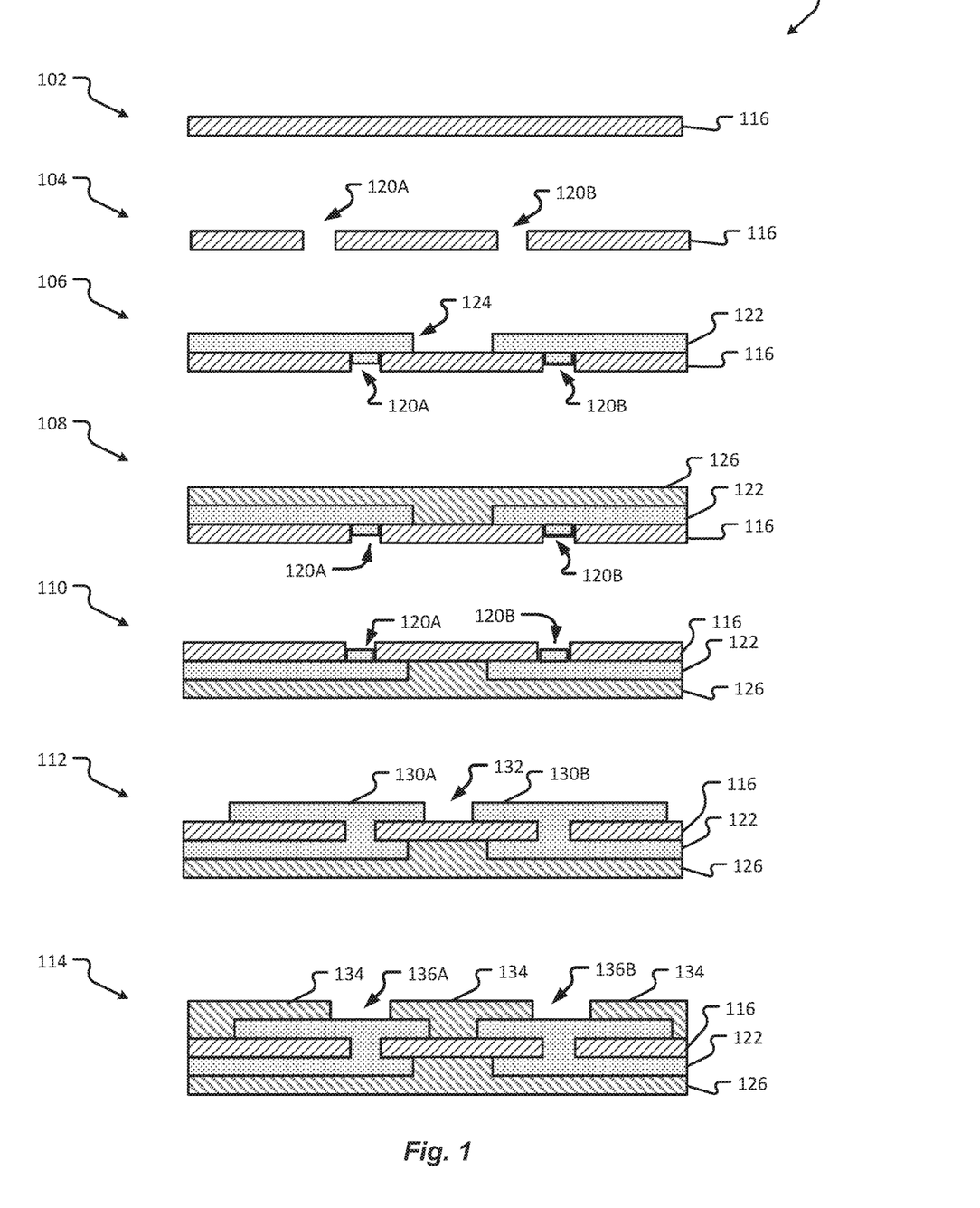
FIG. 1 illustrates a first embodiment of a substrate with contact pads in accordance with embodiments of the disclosure.

FIG. 1 illustrates series 100 of layers to form substrate 116 with contact pads 236 in accordance with embodiments of the disclosure. In diagram 102, substrate 116 is provided. Substrate 116 is a non-conductive substrate. As described herein, substrate 116 may be rigid, formable (i.e., initially planar and subsequently made non-planar or vice versa), or flexible, such as may be utilized for to facilitate clothing with wearable electronics. Diagram 104 illustrates vias 120 through substrate 116. Vias 120 may be mechanically or laser drilled. Next diagram 106 illustrates conductive ink layer 122 applied to substrate 116. Conductive ink layer 122 may be selectively applied to substrate 116, such as to form non-shorting contact pads, such as contact pads 136, and/or traces. It should be appreciated that gap 124 may be utilized to separate different pathways or omitted, such as when only one contact pad is desired or combined, such as when two or more conductive pads are utilized for the same signals and/or to provide additional mechanical support of an attached electronic component. Conductive ink layer 122 may fill via 120A and/or via 12013 completely or partially. Curing or drying of conductive ink layer 122 may be performed following application of conductive ink layer 122 before proceeding to the next step, such as illustrated in diagram 108.

Next, diagram 108 illustrates non-conductive dielectric 126 applied to substrate 116 and, where covered, onto conductive ink layer 122. In diagram 110, substrate 116, and layers attached, are flipped. Flipping substrate 116 facilitates exposure of the (previously) bottom surface of substrate 116 to aid in manufacturing. It should be appreciated that flipping may be omitted when manufacturing processes allow the application of one or more layers on each surface of substrate 116 without the need for flipping. Diagram 112 applies conductive ink layer 130 onto conductive ink layer 122 to meet the surface of conductive ink layer 122 that is within vias 120 and at least a portion on substrate 116. Gap 132 may be formed when conductive ink layer 130A has a different potential from conductive ink layer 13013 to avoid shorting therebetween. Curing or drying of conductive ink layer 130 may be done before proceeding with further processing, such as those illustrated in diagram 114. Diagram 114 applies non-conductive dielectric 134 to substrate 116, where exposed, and conductive ink layer 130 leaving therein contact pads 136 operable to receive a pin, wire, or other component for electrical and/or mechanical attachment thereto.

Figure 2:
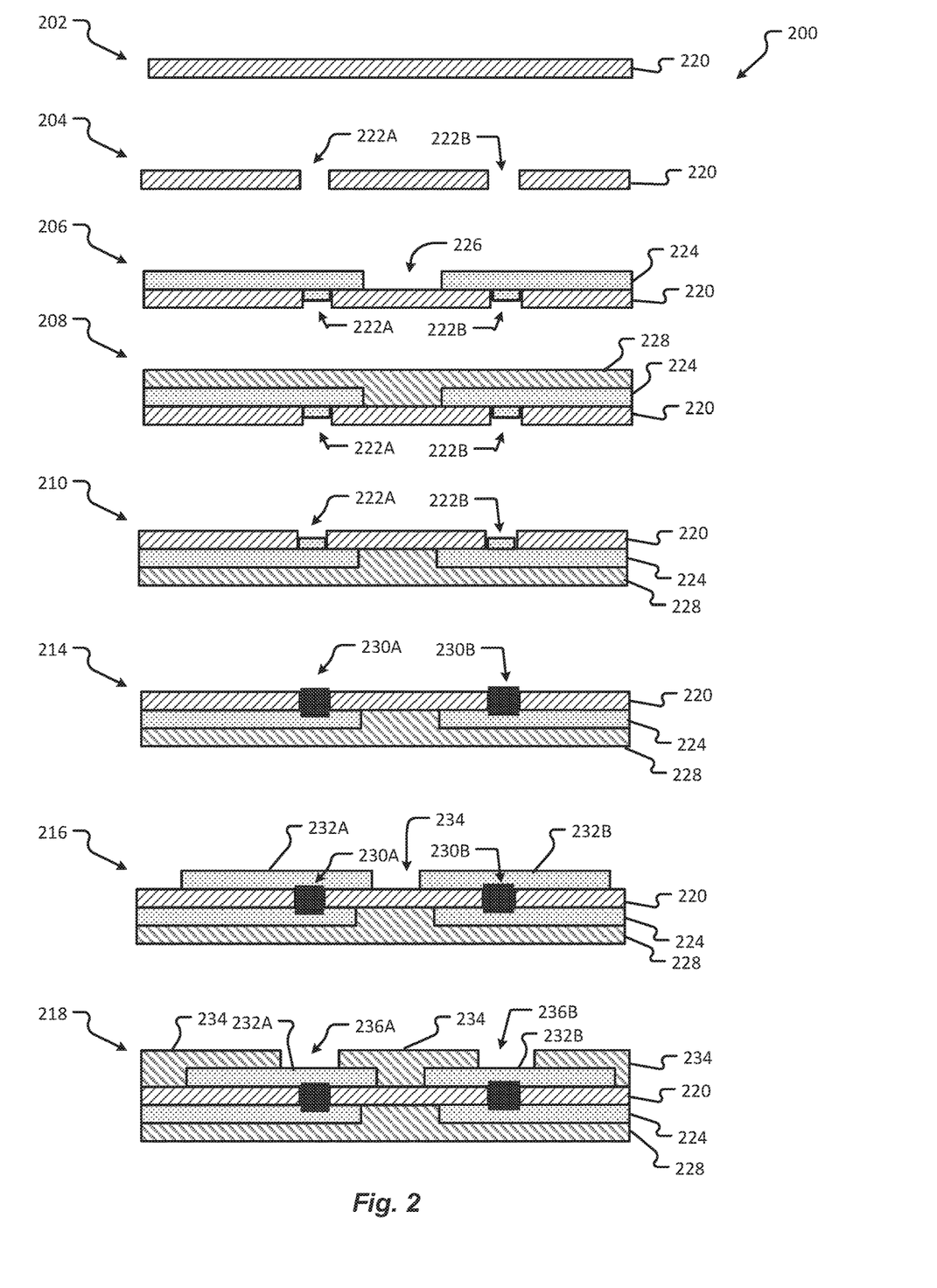
FIG. 2 illustrates a second embodiment of a series of layers to form a substrate with contact pads in accordance with embodiments of the disclosure.

FIG. 2 illustrates series 200 of layers to form substrate 220 with contact pads 236 in accordance with embodiments of the disclosure. In one embodiment, diagram 202 shows substrate 220. Substrate 220 is a non-conductive substrate. As described herein, substrate 220 may be rigid, formable (i.e., initially planar and subsequently made non-planar or vice versa), or flexible, such as may be utilized for to facilitate clothing with wearable electronics. Diagram 204 illustrates substrate 220 with vias 222, such as via 222A and 222B. Next, diagram 206 illustrates conductive ink 224 is applied to substrate 220. In one embodiment, conductive ink 224 does not fill either vias 222 in another embodiment, conductive ink 224 at least partially, but not entirely, fills at least one vias 222. Conductive ink 224 may for electrically distinct portions by incorporating gap 226. Conductive ink 224 may be cured or dried after application thereof, Next, diagram 208 illustrates non-conductive dielectric layer 228 applied to substrate 220, where exposed, and conductive ink 224, Diagram 210 illustrates substrate 220 with layers applied thereon, flipped, such as to accommodate manufacturing processes that can only work one side or substrate 220 at a time. Flipping substrate 220 may be omitted when manufacturing techniques are utilized that enable both sides of substrate 220 to be worked.

Diagram 214 illustrates conductive ink 230 filling vias 222. Overflow onto the surface of substrate 220 is omitted. Diagram 216 illustrates conductive ink 232 applied to substrate 220 and ones of conductive ink 230A or conductive ink 230B. Gap 234 is provided to avoid shorting between conductive ink 232A and conductive ink 232B. Conductive ink 232 may be cured or dried after application thereof. Diagram 218 illustrates non-conductive dielectric layer 234 applied to substrate 220, when exposed, and otherwise conductive ink 232 to form contact pads 236.

Figure 3:
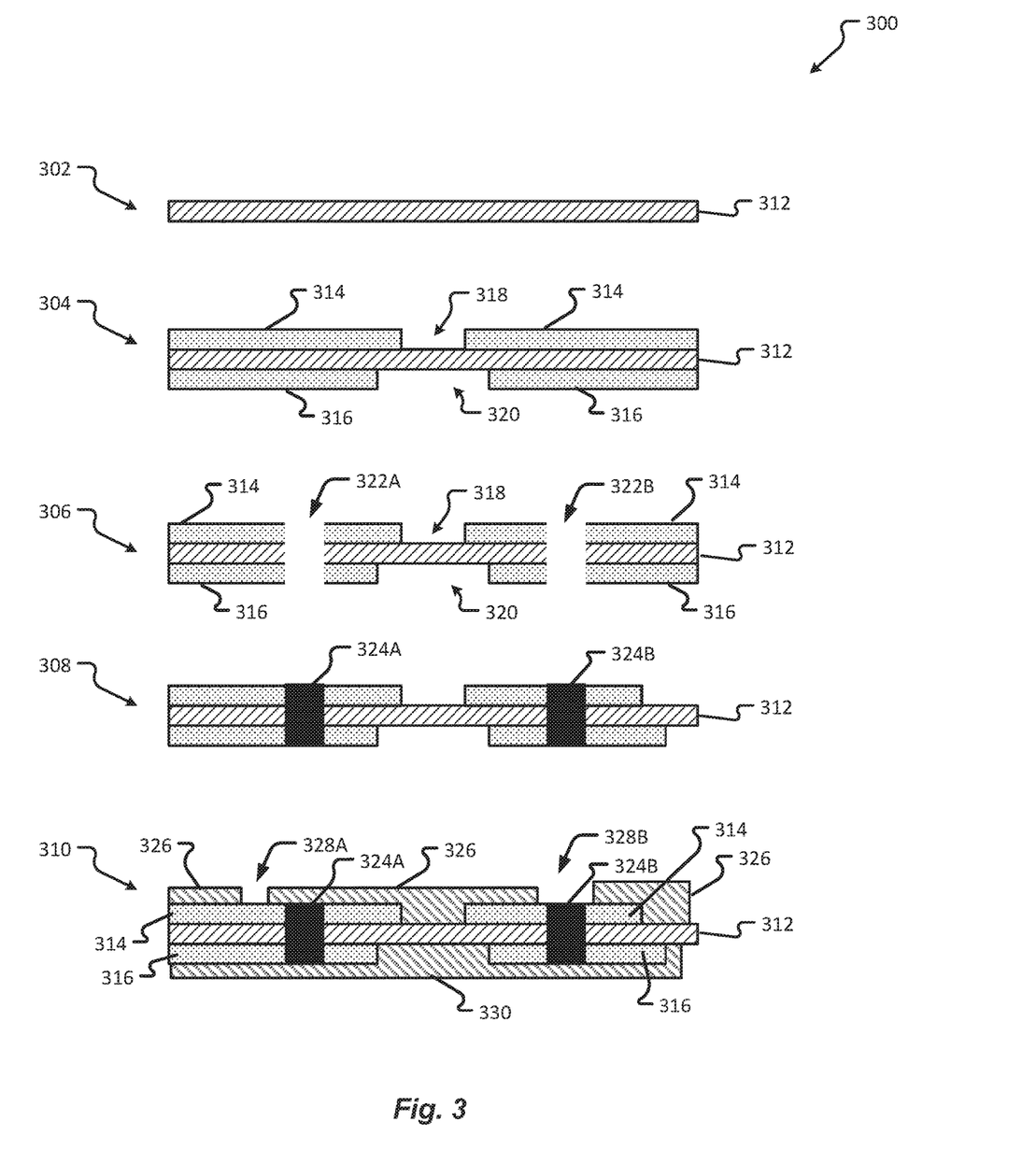
FIG. 3 illustrates a third embodiment of a series of layers to form a substrate with contact pads in accordance with embodiments of the disclosure.

FIG. 3 illustrates series 300 of layers to form substrate 312 with contact pads 328 in accordance with embodiments of the disclosure. In one embodiment, substrate 312 is provided as illustrated in diagram 302. Substrate 312 is a non-conductive substrate. As described herein, substrate 312 may be rigid, formable (i.e., initially planar and subsequently made non-planar or vice versa), or flexible, such as may be utilized for to facilitate clothing with wearable electronics. Diagram 304 illustrates conductive ink 314, applied to a top side of substrate 312, and conductive ink 316, applied to a bottom side of substrate 312. Gap 318 and/gap 320 may be provided to separate portions of conductive ink 314 into electrically separate portions and, similarly, separate portions of conductive ink 316 into electrically separate portions, respectively. Conductive ink 314 and/or conductive ink 316 may be cured or dried after application thereof.

Diagram 306 illustrates vias 322 formed through each of substrate 312, conductive ink 314 and conductive ink 316. Vias 322 may be mechanically or laser drilled. Next, diagram 308 illustrates the application of conductive ink 324 into vias 322. Conductive ink 324 may be dried or cured after application thereof. Diagram 310 illustrates, non-Conductive dielectric layers 326 and 330 applied to substrate 312, where exposed, conductive ink 324, conductive ink 314, and conductive ink 316. The application of non-conductive dielectric layer 326 omits portions to create contact pads 328A, to facilitate attachment of a component to conductive ink 314, or directly contact conductive ink 324B as contact pad 328B.

Figure 4:
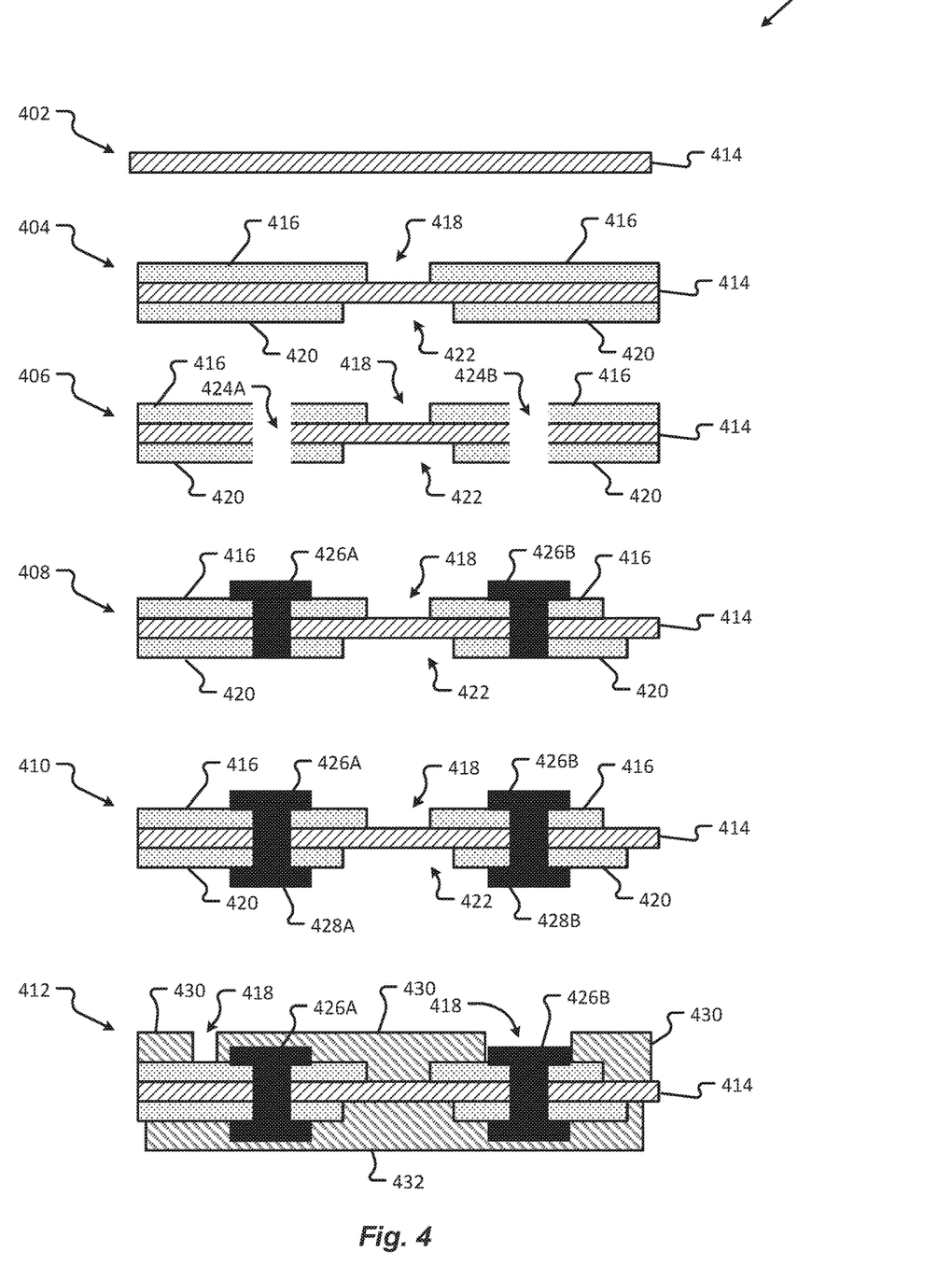
FIG. 4 illustrates a fourth embodiment of a series of layers to form a substrate with contact pads in accordance with embodiments of the disclosure.

FIG. 4 illustrates series 400 of layers to form substrate 414 with contact pad 418 in accordance with embodiments of the disclosure. Diagram 402 illustrates substrate 414. In one embodiment, substrate 414 is provided as a non-conductive substrate. As described herein, substrate 412 may be rigid, formable (i.e., initially planar and subsequently made non-planar or vice versa), or flexible, such as may be utilized for to facilitate clothing with wearable electronics.

Diagram 404 illustrates substrate 414 with conductive ink layers 416 and 420 forming gaps 418 and 422, respectively. Portions of conductive ink layer 416 are separated by gap 418 and portions of conductive ink layer 420 are electrically separated by gap 422. Conductive ink layers 416 and/or 420 may be cured or dried after application. Diagram 406 illustrates vias 424 through each of conductive ink layer 416, substrate 414 and conductive ink layer 420 in diagram 408. Vias 424 may be filled or overfilled, with conductive ink 426. Overfilling conductive ink 426 onto the top surface of conductive ink layer 426A provides a wider area for improved contact and/or formation of a contact pad (e.g., contact pad 426B). Conductive ink 426 may be cured or dried after application thereof. In diagram 410, conductive ink 428 is applied to the bottom surface of conductive ink layer 420 over vias 424 to similarly provide additional bonding and/or conductive surface. Non-conductive dielectric layers 430 and 432 are subsequently selectively applied over substrate 414, where exposed, conductive ink layers 416 and 420, and conductive ink 426. In one embodiment, contact pad 418 is formed within non-conductive dielectric layer 430 facilitating attachment to conductive ink layer 416. In another embodiment, contact pad 418 is formed in a gap within dielectric layer 430 onto conductive ink 426B.

Figure 5:
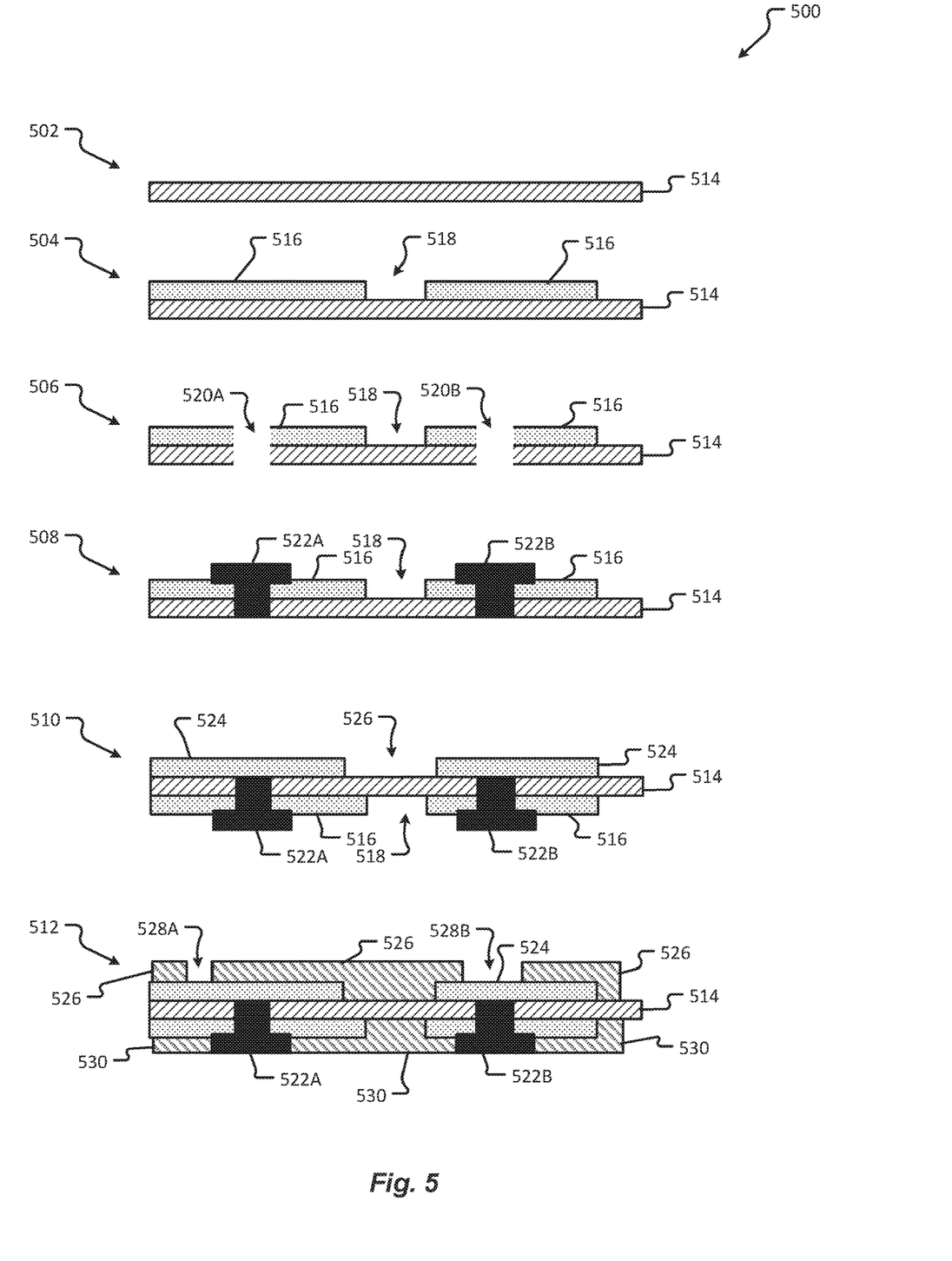
FIG. 5 illustrates a fifth embodiment of a series of layers to form a substrate with contact pads in accordance with embodiments of the disclosure.

FIG. 5 illustrates series 500 of layers to form substrate 514 with contact pads in accordance with embodiments of the disclosure. Diagram 502 illustrates substrate 514. In one embodiment, substrate 512 is provided as illustrated in diagram 302. Substrate 512 is a non-conductive substrate. As described herein, substrate 512 may be rigid, formable (i.e., initially planar and subsequently made non-planar or vice versa), or flexible, such as may be utilized for to facilitate clothing with wearable electronics. Diagram 504 illustrates conductive ink layer 516 on a top surface of substrate 514. Portions of conductive ink layer 516 are electrically separated by gap 518. Conductive ink layer 516 may be cured or dried after application thereof. Diagram 506 illustrates vias 520, such as upon mechanical or laser ablation drilling.

Diagram 508 illustrates conductive ink 522 placed within vias 520 and overfilling to extend on top of conductive ink layer 516, without compromising the electrical separation of the portions separated by gap 518. Conductive ink 522 may be cured or dried after application thereof. Diagram 510 illustrates substrate 514 and portions added thereto, flipped, such as to accommodate top-down access to the former bottom surface of substrate 514, which may be omitted in other embodiments if appropriate manufacturing process allow.

Diagram 512 illustrates substrate 514 with non-conductive dielectric layers 526 and 530 applied thereto. Non-conductive dielectric layer 526 may have gaps such as to form contact pad 528 and 524 to facilitate attachment of electronic components to portions of conductive ink layer 516. Additionally or alternatively, conductive ink 522 may be exposed to facilitate other connections and serve as their own contact pad.

Figure 6:
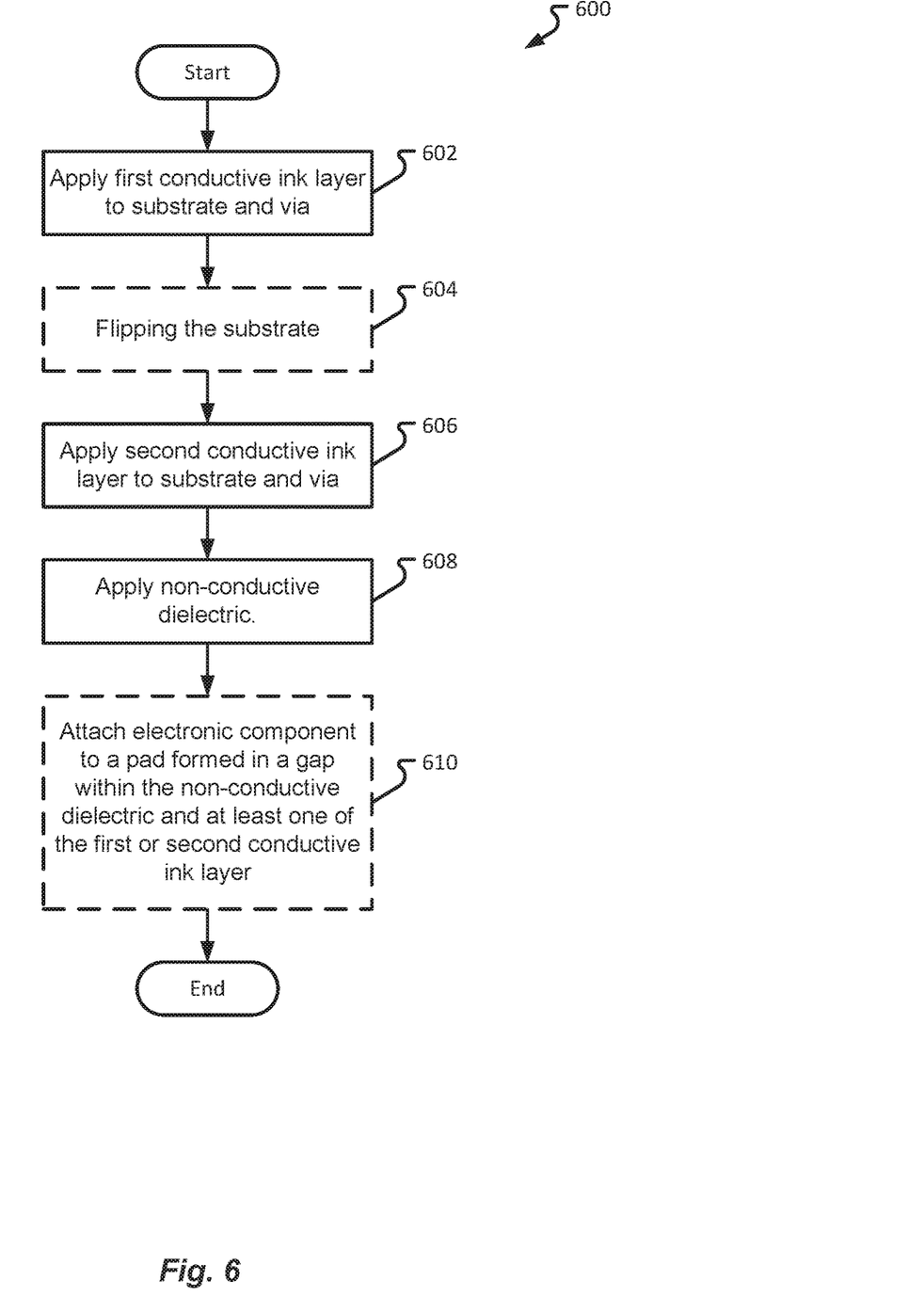
FIG. 6 illustrates a first process in accordance with embodiments of the disclosure.

FIG. 6 illustrates process 600 in accordance with embodiments of the disclosure. Process 600 may be executed by one or more machines and, in step 602, a first layer of conductive ink is selectively applied to a substrate. Optional step 604 flips the substrate to allow access to the, formerly, bottom of the substrate. If access each side of the substrate is provided by other means, step 604 may be omitted. Next step 606 selectively applies a second layer of conductive ink to the substrate on the surface opposite that having conductive ink layer applied in step 602. Vias may be filled with conductive ink in step 602 alone, step 606 alone, or partially filled by one of steps 602 or 606 and completely filled by the other of steps 602 or 606. It should be appreciated that after each conductive layer is applied, the ink may be cured or dried. Alternatively, after both the first and second conductive layers are applied, the ink may be cured or dried. The selection of portions of the substrate to cover with conductive ink is in accordance with the placement and geometry of the conductive pads and/or traces therebetween in accordance with the electronic components that will be attached thereto. Connections between pads may be made, such as to facilitate communication signals and/or electrical potential for two or more electronic components attached thereto. Similarly, the connections may be electrically isolated to enable more than one non-shorting circuit.

Step 608 applies a non-conductive dielectric to the conductive ink, except where omitted to form contact pads. Process 600 may end there or subsequently proceed to optional step 610 whereby electronic components are attached to the conductive ink within the gaps in the non-conductive dielectric.

Figure 7:
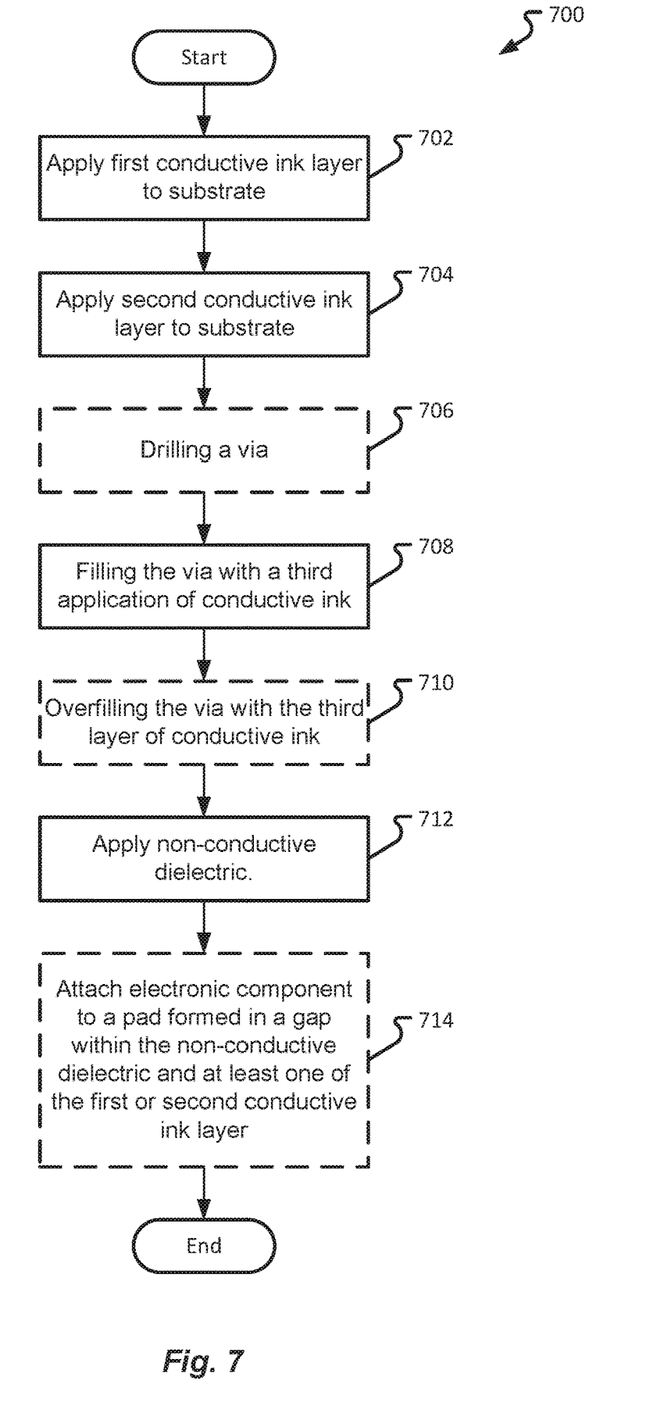
FIG. 7 illustrates a second process in accordance with embodiments of the disclosure.

FIG. 7 illustrates process 700 in accordance with embodiments of the disclosure. Process 700 may be executed by one or more machines and, in step 702, a first layer of conductive ink is selectively applied to a first surface of a substrate. Curing or drying of the first layer may occur following step 702 or following step 704, wherein a second layer of conductive ink is selectively applied to the second surface of the substrate. Optional step 706 drills vias, such as via mechanical or laser drilling. If step 706 is omitted, the substrate may not have electrically connections that both begin and end on the same side of the substrate and, instead of through-vias, openings in the dielectric are provided to one of the first or second conductive ink layer.

Step 708 fills the vias with a third application of conductive ink. Optionally, the vias may be overfilled in step 710 such as to provide additional bonding surface. The conductive ink may be cured or dried. Step 712 selectively applies a non-conductive to the substrate and/or other exposed surfaces except for portions designated to be contact pads, Process 700 may terminate or proceed to step 714 whereby electronic components are attached to the contact pads.

The phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B, and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation done without material human input when the process or operation is performed. However; a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The term "computer-readable medium," as used herein, refers to any tangible storage that participates in providing instructions to a microprocessor for execution. Such a medium may take many forms, including, but not limited to, non-volatile media, volatile media, and transmission media. Non-volatile media includes, for example, NVRAM, or magnetic or optical disks. Volatile media includes dynamic memory; such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, an EPROM, a FLASH-EPROM, a solid-state medium like a memory card, any other memory chip or cartridge, or any other medium from which a computer can read. When the computer-readable media is configured as a database, it is to be understood that the database may be any, type of database, such as relational, hierarchical, object-oriented, and/or the like. Accordingly, the disclosure is considered to include a tangible storage medium and prior art-recognized equivalents and successor media, in which the software implementations of the present disclosure are stored.

While machine-executable instructions may be stored and executed locally to a particular machine (e.g., personal computer, mobile computing device, laptop, etc.), it should be appreciated that the storage of data and/or instructions and/or the execution of at least a portion of the instructions may be provided via connectivity to a remote data storage and/or processing device or collection of devices, commonly known to as "the cloud," but may include a public, private; dedicated, shared and/or other service bureau, computing service, and/or "server farm."

In the foregoing description, for the purposes of illustration, methods were described in a particular order. It should be appreciated that in alternate embodiments, the methods may be performed in a different order than that described without departing from the scope of the embodiments. It should also be appreciated that the methods described above may be performed as algorithms executed by hardware components (e.g., circuitry) purpose-built to carry out one or more algorithms or portions thereof described herein. In another embodiment, the hardware component may comprise a general-purpose microprocessor (e.g., CPU, GPU) that is first converted to a special-purpose microprocessor. The special-purpose microprocessor then having had loaded therein encoded signals causing the, now special-purpose, microprocessor to maintain machine-readable instructions to enable the microprocessor to read and execute the machine-readable set of instructions derived from the algorithms and/or other instructions described herein. The machine-readable instructions utilized to execute the algorithm(s), or portions thereof, are not unlimited but utilize a finite set of instructions known to the microprocessor. The machine-readable instructions may be encoded in the microprocessor as signals or values in signal-producing components and included, in one or more embodiments, voltages in memory circuits, configuration of switching circuits, and/or by selective use of particular logic gate circuits. Additionally or alternative, the machine-readable instructions may be accessible to the microprocessor and encoded in a media or device as magnetic fields, voltage values, charge values, reflective/non-reflective portions, and/or physical indicia.

In another embodiment, the microprocessor further comprises one or more of a single microprocessor, a multi-core processor, a plurality of microprocessors, a distributed processing system (e.g., array(s), blade(s), server farm(s), "cloud", multi-purpose processor array(s), cluster(s), etc.) and/or may be co-located with a microprocessor performing other processing operations. Any one or more microprocessor may be integrated into a single processing appliance (e.g., computer, server, blade, etc.) or located entirely or in part in a discrete component connected via a communications link (e.g., bus, network, backplane, etc. or a plurality thereof).

Examples of general-purpose microprocessors may comprise, a central processing unit (CPU) with data values encoded in an instruction register (or other circuitry maintaining instructions) or data values comprising memory locations, which in turn comprise values utilized as instructions. The memory locations may further comprise a memory location that is external to the CPU. Such CPU-external components may be embodied as one or more of a field-programmable gate array (FPGA), read-only memory (ROM), programmable read-only memory (PROM), erasable programmable read-only memory (EPROM), random access memory (RAM), bus-accessible storage, network-accessible storage, etc.

These machine-executable instructions may be stored on one or more machine-readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

Also, it is noted that the embodiments were described as a process, which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine-readable medium, such as a storage medium. A microprocessor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Embodiments herein comprising software are executed, or stored for subsequent execution, by one or more microprocessors and are executed as executable code. The executable code being selected to execute instructions that comprise the particular embodiment. The instructions executed being a constrained set of instructions selected from the discrete set of native instructions understood by the microprocessor and, prior to execution, committed to microprocessor-accessible memory. In another embodiment, human-readable "source code" software, prior to execution by the one or more microprocessors, is first converted to system software to comprise a platform (e.g., computer, microprocessor, database, etc.) specific set of instructions selected from the platform's native instruction set.

While illustrative embodiments of the disclosure have been described in detail herein, it is to be understood that the inventive concepts may be otherwise variously embodied and employed, and that the appended claims are intended to be construed to include such variations, except as limited by the prior art.

The ensuing description provides embodiments only and is not intended to limit the scope, applicability, or configuration of the claims. Rather, the ensuing description will provide those skilled in the art with an enabling description for implementing the embodiments. It will be understood that various changes may be made in the function and arrangement of elements without departing from the spirit and scope of the appended claims.

Any reference in the description comprising an element number, without a subelement identifier when a subelement identifier exists in the figures, when used in the plural, is intended to reference any two or more elements with a like element number. When such a reference is made in the singular form, it is intended to reference one of the elements with the like element number without limitation to a specific one of the elements. Any explicit usage herein to the contrary or providing further qualification or identification shall take precedence.

The exemplary systems and methods of this disclosure will also be described in relation to analysis software, modules, and associated analysis hardware. However, to avoid unnecessarily obscuring the present disclosure, the following description omits well-known structures, components, and devices, which may be omitted from or shown in a simplified form in the figures or otherwise summarized.

For purposes of explanation, numerous details are set forth in order to provide a thorough understanding of the present disclosure. It should be appreciated, however, that the present disclosure may be practiced in a variety of ways beyond the specific details set forth herein.

The terms "determine," "calculate," and "compute," and variations thereof, as used herein, are used interchangeably and include any type of methodology, process, mathematical operation, or technique.

The term "module," as used herein, refers to any known or later-developed hardware, software, firmware, artificial intelligence, fuzzy logic, or combination of hardware and software that is capable of performing the functionality associated with that element. Also, while the disclosure is described in terms of exemplary embodiments, it should be appreciated that other aspects of the disclosure can be separately claimed.

What is claimed is:

1. A method for forming a contact pad on a substrate having a first and second side, comprising:
   applying a first layer of conductive ink to a first selected portion of the first side of the substrate forming a first conductive layer, wherein the selected portion comprises the via and wherein the conductive ink at least partially fills the via;
   applying a second layer of conductive ink to second selected portions of the second side of the substrate, wherein the second selected portions comprise the via; and
   applying a second non-conductive dielectric layer to selected portions of the second conductive layer to form therein the contact pad on the second conductive layer;
   filling the via with a third layer of conductive ink comprising overfilling the via to spread the conductive ink beyond the via and onto the first layer of conductive ink; and applying a first layer of non-conductive dielectric that omits covering the conductive ink that is beyond the via on the first layer of conductive ink to form the contact pad therein; and curing the third layer of conductive ink; and wherein the substrate is non-conductive.

2. The method of claim 1, further comprising flipping the substrate after applying the first layer conductive ink and before applying the second layer of conductive ink.

3. The method of claim 1, further comprising applying the first non-conductive dielectric layer to selected portions of the first conductive layer.

4. The method of claim 1, wherein the via is formed in the substrate and the first and second layer of conductive ink, after application of the first and second layer of conductive ink and before the application of the second non-conductive dielectric layer.

5. The method of claim 1, further comprising, filling the via with the third layer of conductive ink further comprises overfilling the via to spread the conductive ink beyond the via and onto the second layer of conductive ink.

6. The method of claim 1, wherein the conductive ink is not solderable.

7. The method of claim 1, wherein the via is formed in the substrate and the first layer of conductive ink, after application of the first layer of conductive ink and before the application of the second layer of conductive ink.

8. The method of claim 7, further comprising:

filling and overfilling the via with a third layer of conductive ink, wherein overfilling spreads the conductive ink beyond the via and onto the first layer of conductive ink; and curing the third layer of conductive ink.

9. The method of claim 8, further comprising, flipping the substrate upon curing of the third layer of conductive ink.

10. An electronic device, comprising:

a substrate having a first and second side, wherein the substrate is non-conductive;

a via in the substrate extending from the first side, through the substrate, to the second side;

a first layer of conductive ink applied to a first selected portion of the first side of the substrate to form a first conductive layer, wherein the conductive ink at least partially fills the via;

a second layer of conductive ink applied to second selected portions of the second side of the substrate, wherein the second selected portions comprise the via;

a second non-conductive dielectric layer applied to selected portions of the second conductive layer to form therein the contact pad on the second conductive layer;

a third layer of conductive ink filling the via comprising an overfilled portion extending beyond the via and onto the first layer of conductive ink; and wherein the third layer of conductive ink is cured; and wherein a first layer of non-conductive dielectric omits coverage of the conductive ink that is beyond the via on the first layer of conductive ink to form the contact pad therein.

11. The electronic device of claim 10, comprising the first non-conductive dielectric layer to selected portions of the first conductive layer.

12. The electronic device of claim 10, wherein the third layer of conductive ink further comprises an overfilled portion extending beyond the via and onto the second layer of conductive ink.

13. The electronic device of claim 10, wherein the conductive ink is non-solderable.

14. The electronic device of claim 10, wherein the substrate is flexible.

15. An electronics assembly, comprising:

a substrate having a first and second side, wherein the substrate is non-conductive;

a via in the substrate extending from the first side, through the substrate, to the second side;

a first layer of conductive ink applied to a first selected portion of the first side of the substrate to form a first conductive layer, wherein the conductive ink at least partially fills the via;

a second layer of conductive ink applied to second selected portions of the second side of the substrate, wherein the second selected portions comprise the via;

a second non-conductive dielectric layer applied to selected portions of the second conductive layer to form therein the contact pad on the second conductive layer; and an electronic component including an electrical connection point, wherein a solder paste is applied to at least one of the contact pad and the electrical connection point, wherein the electrical connection point and the contact pad are placed in a position adjacent to each other, wherein the solder paste engages each of the contact pad and the electrical connection point, and wherein the solder paste is heated to electrically couple the electrical connection point to the contact pad;

a third layer of conductive ink filling the via comprising an overfilled portion extending beyond the via and onto the first layer of conductive ink; and wherein the third layer of conductive ink is cured; and wherein a first layer of non-conductive dielectric omits coverage of the conductive ink that is beyond the via on the first layer of conductive ink to form the contact pad therein.

\* \* \* \* \*